(12) United States Patent
Pavone

(10) Patent No.: US 12,006,207 B2
(45) Date of Patent: Jun. 11, 2024

(54) PRESSURE SENSOR INCLUDING A MICROELECTROMECHANICAL TRANSDUCER AND RELATING PRESSURE-DETECTION METHOD

(71) Applicant: STMICROELECTRONICS S.r.l., Agrate Brianza (IT)

(72) Inventor: Mario Giuseppe Pavone, Giarre (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 0 days.

(21) Appl. No.: 18/060,333

(22) Filed: Nov. 30, 2022

(65) Prior Publication Data

US 2023/0104798 A1    Apr. 6, 2023

Related U.S. Application Data

(62) Division of application No. 16/799,747, filed on Feb. 24, 2020, now Pat. No. 11,535,508.

(30) Foreign Application Priority Data

Feb. 25, 2019 (IT) ..................... 102019000002663

(51) Int. Cl.
*B81B 3/00* (2006.01)
*G01L 9/00* (2006.01)

(52) U.S. Cl.
CPC .......... *B81B 3/0037* (2013.01); *G01L 9/0054* (2013.01); *B81B 2201/0264* (2013.01)

(58) Field of Classification Search
CPC .......... B81B 3/0037; B81B 2201/0264; G01L 9/0054; G01L 9/0045; G01L 9/0044
See application file for complete search history.

(56) References Cited

U.S. PATENT DOCUMENTS

| | | | |
|---|---|---|---|
| 4,944,187 A | 7/1990 | Frick et al. | |
| 6,713,828 B1 | 3/2004 | Chavan et al. | |
| 6,968,744 B1 | 11/2005 | Silverbrook et al. | |
| 2013/0036827 A1 | 2/2013 | Besling | |
| 2015/0260597 A1* | 9/2015 | Pagani | G01L 27/002 29/25.35 |
| 2016/0370242 A1 | 12/2016 | Duqi et al. | |
| 2018/0124521 A1 | 5/2018 | Giusti et al. | |
| 2019/0316679 A1 | 10/2019 | Warren | |

(Continued)

FOREIGN PATENT DOCUMENTS

| | | | |
|---|---|---|---|
| CN | 104568243 | * | 5/2017 |
| CN | 108700482 A | | 10/2018 |
| WO | WO 2019099821 A1 | | 5/2019 |

OTHER PUBLICATIONS

Machine translation of CN 104568243 (Year: 2017).*

(Continued)

*Primary Examiner* — Yasser A Abdelaziez
(74) *Attorney, Agent, or Firm* — Seed IP Law Group LLP

(57) ABSTRACT

A pressure sensor including: a structure which delimits a main cavity of a closed type, the structure being at least partially deformable as a function of a pressure external to the structure; and a MEMS device, which is arranged in the main cavity and generates an output signal, which is of an electrical type and is indicative of the pressure inside the main cavity.

20 Claims, 5 Drawing Sheets

(56) References Cited

U.S. PATENT DOCUMENTS

2019/0316979 A1    10/2019    Tondolo

OTHER PUBLICATIONS

Duan et al. ("Wafer-level Cu—Sn micro-joints with high mechanical strength and low Sn overflow," J. Micromech. Microeng., 25, 097001, 2015) (Year: 2015).*
"LPS25H—MEMS pressure sensor: 260-1260 hPa absolute digital output barometer", STMicroelectronics Data Sheet, Oct. 2018, 43 pages.
Zhang et al., "Optimization of Packaging Process of Piezoresistive Engine Oil Pressure Sensor", *11th International Conference on Electronic Packaging Technology & High Density Packaging*, 2010, pp. 1362-1365.

* cited by examiner

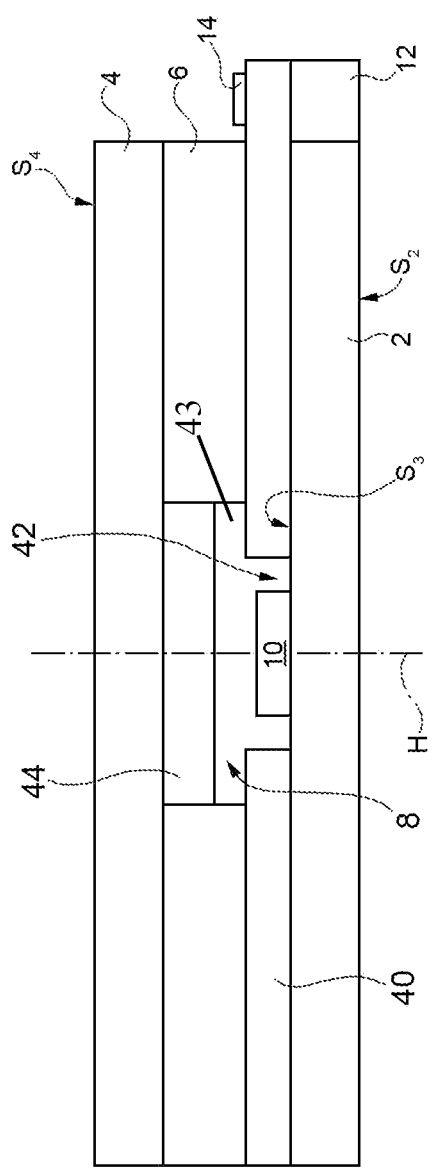

PRESSURE SENSOR INCLUDING A MICROELECTROMECHANICAL TRANSDUCER AND RELATING PRESSURE-DETECTION METHOD

BACKGROUND

Technical Field

The present disclosure relates to a pressure sensor including a MEMS (MicroElectroMechanical System) transducer and to a corresponding pressure-detection method.

Description of the Related Art

As is known, today there is a strong desire for arranging sensors capable of detecting the pressure exerted by mechanical structures. For instance, this desire is felt in the field of structural monitoring, as well as in other industrial fields (for example, within braking systems for motor vehicles).

It is likewise known that today MEMS sensors are available, which define corresponding cavities, which in use are fluidically coupled to the outside world so as to enable detection of variations of the pressure of the gaseous mass in which the MEMS sensors are immersed. Unfortunately, such MEMS sensors are not suitable for detection of the pressures exerted by solid bodies on account of both their brittleness and on account of the fact that they require the aforementioned fluidic coupling with an external gaseous mass, or in any case a fluid mass, to be established.

BRIEF SUMMARY

An object of the present disclosure is hence to provide a sensor that will at least partly overcome the drawbacks of the prior art.

According to the present disclosure, a pressure sensor is provided. At least one embodiment of the present disclosure is a pressure sensor that includes:
  a structure that is at least partially deformable as a function of an external pressure applied to the structure, the structure including a closed main cavity; and
  a MEMS device, arranged in the main cavity and configured to generate an output signal of an electrical type and indicative of a pressure inside the main cavity.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein:

FIGS. 5 to 8 are schematic cross-sectional views of further embodiments of the present sensor.

DETAILED DESCRIPTION

Figure 1:
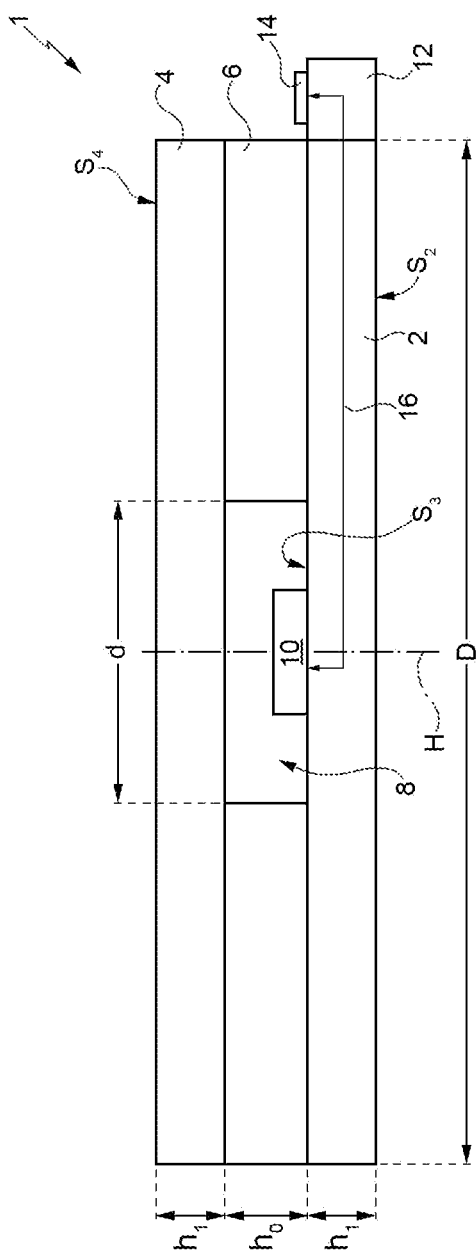
FIG. 1 is a schematic cross-sectional view of an embodiment of the present sensor.

FIG. 1 shows a sensor 1, which comprises a first and a second peripheral region 2,4, and an intermediate region 6, which is arranged between the first and the second peripheral regions 2, 4. As used herein, "region" may include one or more layers of material.

In detail, the first and the second peripheral regions 2, 4 have a cylindrical shape and are formed by laminated material with a high Young's modulus (for example, higher than or equal to 10 GPa), such as, for example, the material known as RO4003, which is made of a plastic resin mixed with ceramic immersed in a woven-glass structure. Moreover, the cylindrical shapes of the first and the second peripheral regions 2, 4 have axes coinciding with an axis H and have bases with a diameter D.

The intermediate region 6 is made of a soft and elastic material, with a low Young's modulus (for example, lower than 1 GPa), for instance, a silicone-based material (e.g., the material known as HT 1250). In particular, the intermediate region 6 has the shape of a hollow cylinder, which has an axis coinciding with the axis H and bases that have the aforementioned diameter D. The intermediate region 6 contacts both the first and the second peripheral regions 2,4 and laterally delimits a cylindrical shaped cavity 8, which has an axis that coincides with the aforementioned axis H; moreover, the bases of the cavity 8 have a diameter d.

The cavity 8, referred to hereinafter as the main cavity 8, is delimited at the bottom by the first peripheral region 2, which is in turn delimited at the bottom by a bottom surface $S_2$. Moreover, the main cavity 8 is delimited at the top by the second peripheral region 4, which is in turn delimited at the top by a top surface $S_4$. Moreover, the main cavity 8 is sealed; i.e., it does not enable gas exchange with the outside world. In practice, the first and the second peripheral regions 2, 4 and the intermediate region 6 form a structure that delimits the sealed main cavity 8.

In greater detail, the first and the second peripheral regions 2, 4 are regions with high stiffness since the material RO4003 has a Young's modulus value of approximately 19 GPa, whereas the intermediate region 6 forms a region with low stiffness since the material HT 1250 has a Young's modulus value of approximately 10 MPa.

In greater detail, the first and the second peripheral regions 2, 4 may have one and the same shape and therefore may have one and the same thickness, designated by $h_1$. The thickness of the intermediate region 6 is designated by $h_0$.

Purely by way of example, the thickness $h_0$ may range, for example, between 1 mm and 2 mm; the thickness $h_1$ may range, for example, between 2.54 mm and 5.08 mm. Moreover, the diameter D may range, for example, between 25 mm and 35 mm, whereas the diameter d may range, for example, between 5 mm and 15 mm. The volume of the main cavity 8 may range, for example, between 20 mm$^3$ and 60 mm$^3$.

The sensor 1 further comprises a MEMS device 10, which is arranged within the main cavity 8. In particular, the first peripheral region 2 is delimited at the top by an intermediate surface $S_3$, on which the MEMS device 10 is arranged.

The MEMS device 10 is a MEMS sensor of a type in itself known, which is adapted to generate an electrical signal indicative of the pressure present within the main cavity 8, as described in greater detail hereinafter.

The sensor 1 also comprises a projecting region 12, which extends in cantilever fashion from the cylindrical body delimited by the outer side walls of the first and the second peripheral regions 2, 4 and of the intermediate region 6. The projecting region 12 forms a single piece with the first peripheral region 2, has the same thickness as the latter, and is delimited at the top by the aforementioned intermediate surface $S_3$. Moreover, arranged on the projecting region 12 is a plurality of conductive pads 14, visible also in FIG. 2, which are electrically connected to the MEMS device 10 through a plurality of conductive paths 16 (one of which is illustrated schematically in FIG. 1), which extend through the first peripheral region 2. In a way in itself known, the MEMS device 10 includes respective conductive pads (not illustrated), which are electrically connected to the conductive paths 16, for example, by wire bonding (not illustrated).

Figure 3:
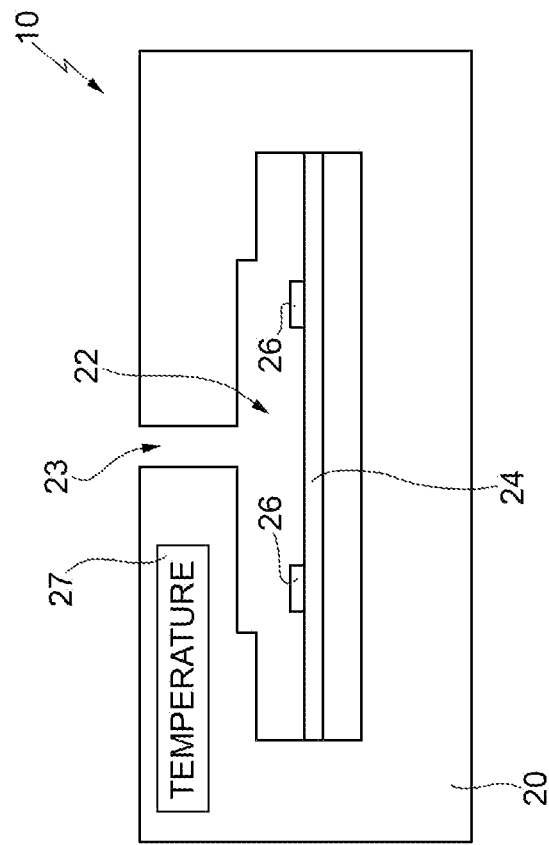
FIG. 3 is a schematic cross-sectional view of a portion of the sensor illustrated in FIG. 1.

In greater detail, and without this implying any loss of generality, the MEMS device 10 may be of the type represented schematically in FIG. 3. In particular, the MEMS device 10 may comprise a fixed structure 20, which delimits a secondary cavity 22, extending in which is a membrane 24, on which transducers 26 are arranged adapted to generate electrical signals indicative of the deformation of the membrane 24. The secondary cavity 22 is fluidically coupled to the main cavity 8, for example by means of a through hole 23, which traverses part of the fixed structure 20 so that the pressure inside the secondary cavity 22 is equal to the pressure of the main cavity 8. Moreover, possible pressure variations that arise inside the main cavity 8 cause corresponding pressure variations inside the secondary cavity 22. In turn, the pressure variations inside the secondary cavity 22 cause consequent deformations of the membrane 24, which are detected by the transducers 26. In a way in itself known, the MEMS device 10 may also comprise an electronic read circuit (not illustrated), electrically coupled to the transducers 26 and adapted to generate an output signal, which is indicative of the pressure in the secondary cavity 22 and is then sent, through the conductive paths 16, to the conductive pads 14, where it can be made available to the outside world, as explained hereinafter.

As illustrated once again in FIG. 3, the MEMS device 10 may also include a temperature sensor 27, for example, fixed with respect to the fixed structure 20 and is adapted to detect the temperature of the main cavity 8. In particular, the temperature sensor 27 generates a temperature signal, which is of an electrical type and is indicative of the temperature of the main cavity 8. Moreover, even though it is not illustrated, the temperature sensor 27 is electrically coupled to corresponding conductive pads 14, through corresponding conductive paths 16 so that also the temperature signal is made available to the outside world.

This having been said, present inside the main cavity 8 is a gas, to which to a first approximation the ideal gas law can be applied; namely, $$P_x * V_x = k * T = P_a * V_0$$

where, neglecting for simplicity the volume of the MEMS device 10, $V_0$ denotes the volume of the main cavity 8 when present inside it is the ambient pressure, designated by $P_a$, this condition arising when the pressure outside of the sensor 1 is also equal to the ambient pressure $P_a$. Moreover, $V_x$ is the volume of the main cavity 8, when a generic pressure $P_x$ is present therein. In addition, k is a constant that depends upon the number of moles of gas and the perfect-gas constant, and T is the temperature of the gas present in the main cavity 8.

Assuming that the temperature of the gas within the main cavity 8 remains constant, then we have:

$$V_x = P_a * V_0 / P_x$$

Figure 4:
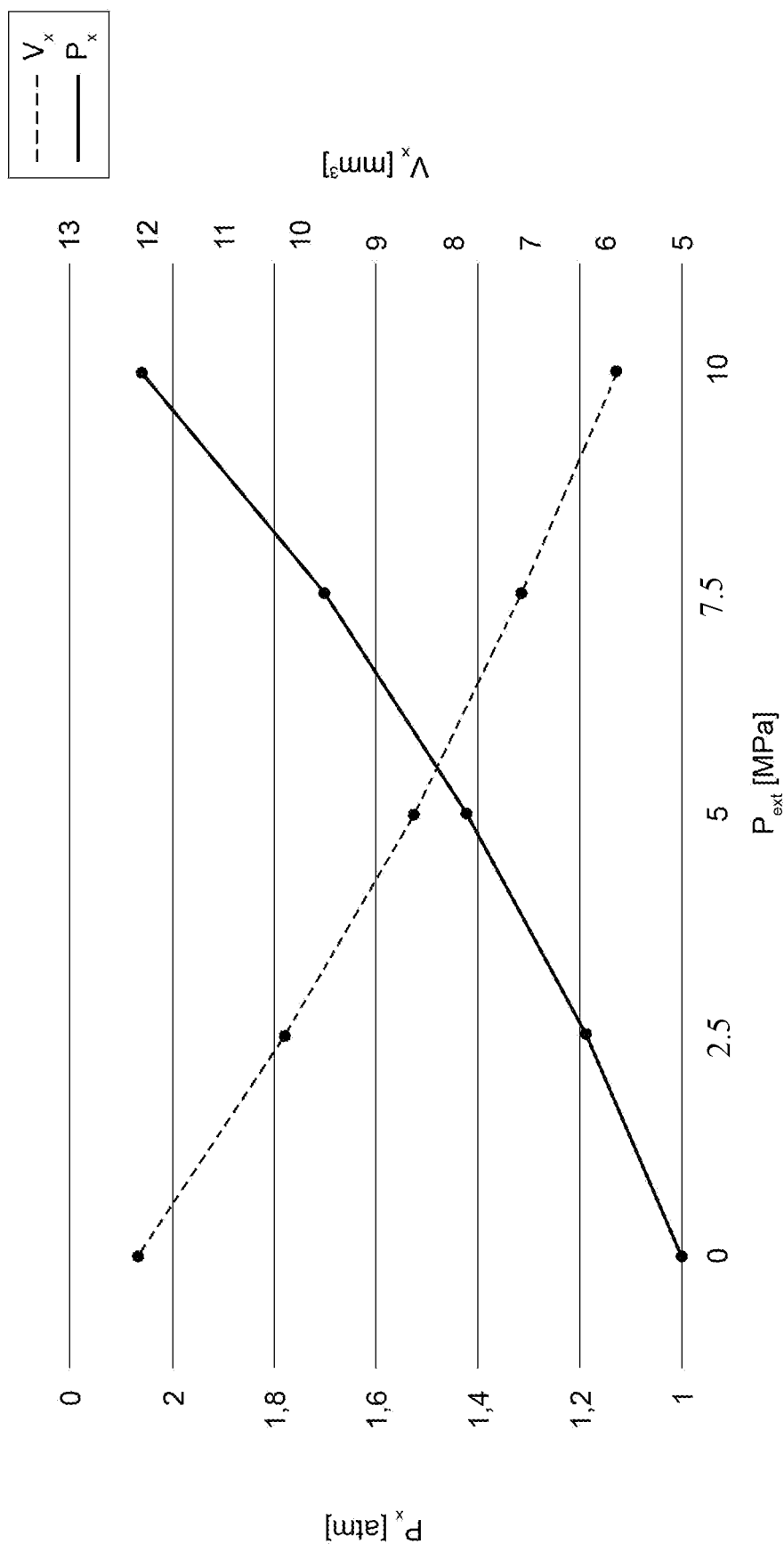
FIG. 4 shows the plots of magnitudes relating to the present sensor, as a function of an external pressure.

This having been said, assuming that the sensor 1 is arranged so that the bottom surface $S_2$ contacts a rigid support and assuming that a uniform external pressure $P_{ext}$ is exerted on the top surface $S_4$, we find that, by setting $P_{ext} = P_a + \Delta P$, the thickness $h_0$ of the intermediate region 6 decreases as $\Delta P$ increases. Consequently, the volume $V_x$ of the main cavity 8 decreases as the pressure $P_x$ increases, as illustrated by way of example in FIG. 4, where it has been assumed that the temperature remains constant. In practice, the output signal generated by the MEMS device 10 is indicative of the value of the volume $V_x$ of the main cavity 8, which in turn depends upon the external pressure $P_{ext}$.

Figure 2:
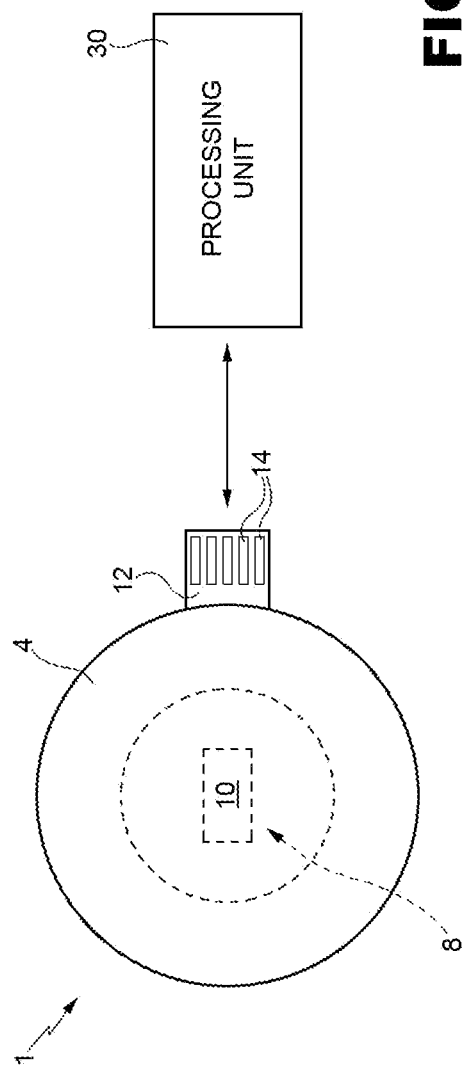
FIG. 2 is a top plan view of the sensor illustrated in FIG. 1.

As illustrated in FIG. 2, the sensor 1, and in particular the conductive pads 24, can be electrically coupled to a processing unit 30, formed, for example, by a microcontroller unit; in this way, the output signal and the temperature signal are supplied to the processing unit 30.

The processing unit 30 can store a data table, in which, given a plurality of temperature sample values, each of these temperature sample values is associated with a corresponding plurality of values of volume of the main cavity 8, each of these values of volume being moreover associated with a corresponding value of the external pressure $P_{ext}$. In this way, on the basis of the temperature of the main cavity 8, represented by the temperature signal, and on the basis of the value of volume $V_x$ of the main cavity 8, represented by the output signal, the processing unit 30 determines a corresponding estimation of the external pressure $P_{ext}$. In this connection, in the case of tensile forces exerted on the sensor 1, the external pressure $P_{ext}$ is lower than the ambient pressure; in order to enable, also in this case, a correct estimation to be obtained, the MEMS device 10 has an operating range that drops below atmospheric pressure (for example, down to approximately 0.2 atm).

By varying the geometry and the materials of the sensor 1, it is possible to vary the operating range of the latter. For instance, if the intermediate region 6 is made of a material having a Young's modulus higher than what has been described previously (for example, in the order of 100 MPa), the operating range increases.

Figure 5:
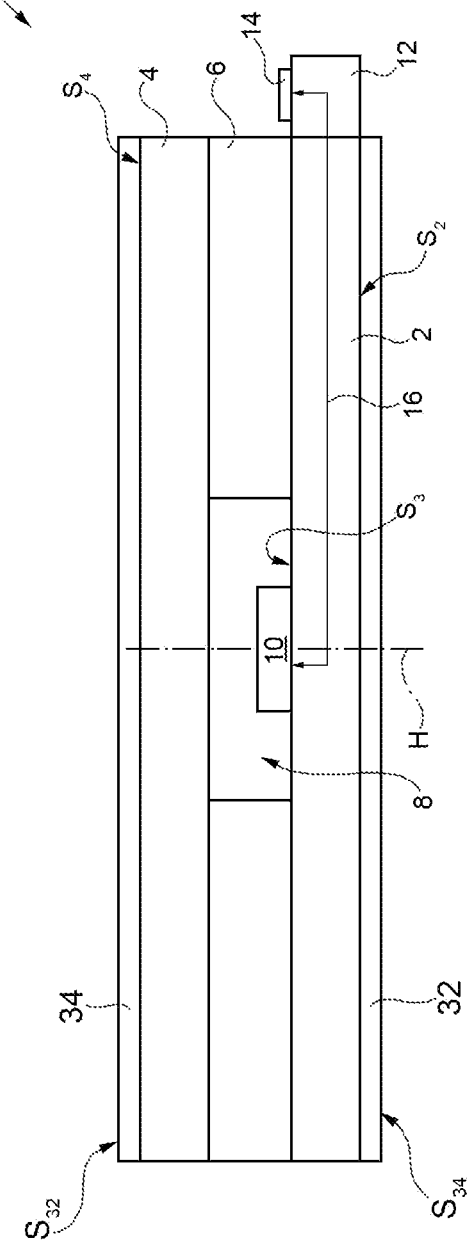

It is likewise possible to vary the operating range of the sensor 1 by using stiffening elements. For instance, as illustrated in FIG. 5, the sensor may include first and second stiffening regions 32, 34, which are made, for example, of a metal (e.g., copper, which has a Young's modulus value of approximately 110 GPa) or by a ceramic material and are arranged, respectively, below the first peripheral region 2 and above the second peripheral region 4.

In detail, the first stiffening region 32 is delimited at the bottom by an additional bottom surface $S_{32}$, whereas the second stiffening region 34 is delimited at the top by an additional top surface $S_{34}$. Moreover, purely by way of example, each of the first and the second stiffening regions 32, 34 may have a cylindrical shape with a base of diameter D and is aligned along the axis H; moreover, each of the first and the second stiffening regions 32, 34 may have a thickness of the order of the millimetre. In this case, the assembly formed by the first peripheral region 2 and by the first stiffening region 32 is characterised by a greater stiffness than only the first peripheral region 2; similar considerations apply to the second peripheral region 4 and the second stiffening region 34.

In general, the first and the second stiffening regions 32, 34 may be added to each of the embodiments described herein.

FIG. 6, where for simplicity the conductive paths 16 are no longer illustrated, shows an embodiment in which a first and a second additional region 40,44 are present, which are made, for example, of the same material as that of the first and the second peripheral regions 2, 4.

The first additional region 40 is interposed between the intermediate region 6 and the first peripheral region 2 and has, in top plan view, the same shape as the underlying first peripheral region 2, but has an additional cavity portion 42 of the main cavity 8 so as to leave a portion of the intermediate surface $S_3$ exposed, resting on which is the MEMS device 10, which is hence arranged within the additional cavity portion 42. The additional cavity portion 42 has, for example, a cylindrical shape, is coaxial with a main portion 43 of the main cavity 8, is part of the main cavity, and is laterally delimited by the first additional region 40. Moreover, the bases of the additional cavity portion 42 have a diameter smaller than the diameter d of the main portion of the main cavity 8 in the intermediate region 6. In other words, in a direction perpendicular to the axis H, the additional cavity portion 42 has a section with smaller area than the section of the main portion 43 of the main cavity 8. Moreover, in a direction parallel to the axis H, the additional cavity portion 42 has a height smaller than that of the main portion 43 of the main cavity 8.

The second additional region 44 has a cylindrical shape and is arranged below the second peripheral region 4, with which it is in direct contact, so as to occupy a top portion of the main cavity 8. For instance, the second additional region 44 has bases with a diameter equal to the diameter d so as to contact the intermediate region 6 laterally.

In practice, the volume of the additional cavity portion 42 and of the main portion 43 of the main cavity 8 not occupied by the second additional region 44 is smaller than the volume of the main cavity 8, with consequent increase in sensitivity.

As illustrated in FIG. 7, the second additional region, here designated by 144, may be arranged so as to occupy a bottom portion of the main cavity 8, so as to leave a top portion 146 of the main cavity 8 free, as well as to close the additional cavity portion 42 at the top. In this case, the second additional region 144 has a through hole 145, which sets the additional cavity portion 42 in communication with the top portion of the main cavity 8. In practice, the free top portion 146 of the main cavity 8 allows the second peripheral region 4 to move with greater elasticity.

Figure 8:
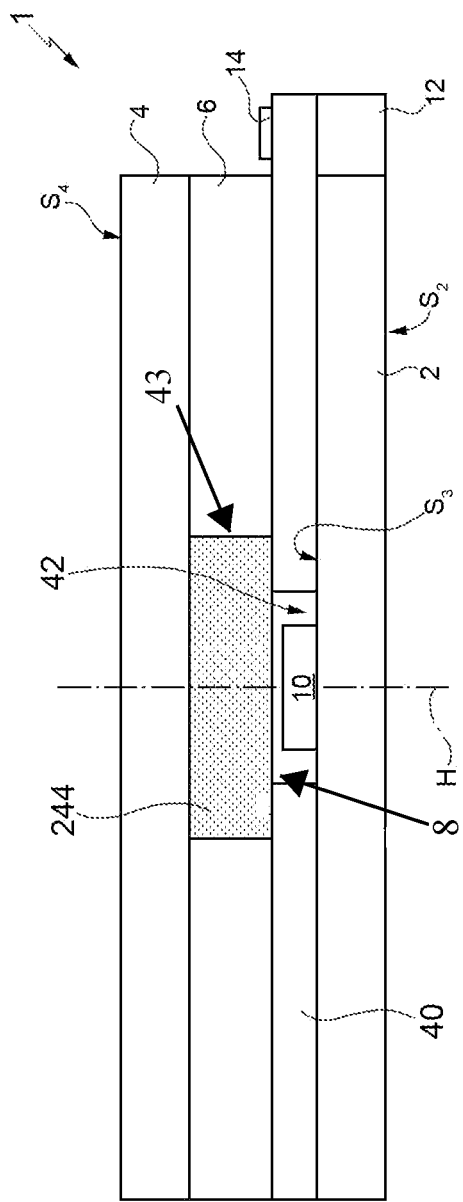

FIG. 8 shows a further embodiment, in which the second additional region, here designated by 244, entirely occupies the main portion 43 of the main cavity 8. Moreover, the second additional region 244 is made of a material with low stiffness (for example, with a Young's modulus value lower than 1 MPa) so as to be less rigid and more deformable than the intermediate region 6. For instance, the second additional region 244 may be made of cellular silicone of a soft type such as BISCO® HT-870. In this case, the considerations set forth previously in regard to the main cavity 8, for example with reference to FIG. 1, apply to the additional cavity portion 42 of the main cavity 8, which is sealed. In particular, as the external pressure increases, there is a deformation of the second additional region 244, which tends to penetrate into the additional cavity portion 42, reducing the volume thereof and, therefore, varying the pressure inside. Thanks to the small volume of the additional cavity portion 42, given the same deformation, the sensitivity is very high.

From what has been described and illustrated previously, the advantages that the present solution affords are evident.

In particular, the present sensor is characterised by a high strength and the capacity of detecting the surrounding pressure, without any need for it to be fluidically coupled to the external environment. In particular, the peripheral regions, which are stiffer, provide protection for the sensor, whereas the intermediate region, which is less stiff and therefore, is greater adapted to undergo deformation (in a substantially elastic way), enables variation of the volume of the main cavity, and therefore also of the pressure inside the main cavity, as a function of the external pressure, which acts on the structure that delimits the main cavity.

Figure 9:
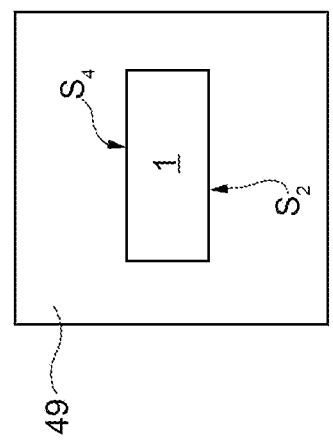
FIG. 9 is a schematic cross-sectional view of a block of cement in which a sensor is embedded.

The present sensor is hence particularly suited for detecting high pressures, such as the pressures that are exerted within a solid body, such as a block of cement 49 illustrated in FIG. 9. In this case, the sensor 1 (for example, of the type designated by 1) can be embedded within the block of cement 49. The part of the block of cement that contacts the sensor 1, and in particular the bottom surface $S_2$ and the top surface $S_4$, exerts a contact pressure on these surfaces, which is detected by the sensor 1.

The present sensor 1 can therefore be used, for example, for the purposes of structural monitoring, or else for detecting the pressure exerted by a braking system. In cases of non-uniform pressures, the pressure sensor 1 detects the average of the pressures exerted above and below the main cavity 8.

In conclusion, it is clear that further modifications and variations may be made to what has been described and illustrated herein, without thereby departing from the scope the present disclosure.

For instance, the first and the second peripheral regions 2, 4 and the intermediate region 6 may have different shapes and/or be made of materials different from what has been described. In particular, reference is made to the first and second materials which indicate the materials that form the first and the second peripheral regions 2, 4, respectively, the materials may have Young's modulus values ranging, for example, between 10 GPa and 200 GPa; moreover, reference is made to the third material which indicates the material that forms the intermediate region 6, the material may have a Young's modulus value ranging, for example, between 0.01 MPa and 100 MPa.

More in general, the embodiments described previously (for example, the geometrical shapes of the cavity) may vary.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
   detecting a pressure exerted on a pressure sensor by a solid body arranged on the pressure sensor, the pressure sensor including:
   a structure that is at least partially deformable as a function of an external pressure applied to the structure, the structure including a sealed main cavity within the structure; and
   a MEMS (microelectromechanical system) device arranged in the sealed main cavity, wherein the detecting includes:
   the MEMS device detecting a pressure in the sealed main cavity while the solid body exerts the pressure on the pressure sensor, which causes a deformation of the sealed main cavity; and detecting the pressure exerted by the solid body based on the pressure in the sealed main cavity detected by the MEMS device.

2. The method according to claim 1, wherein the structure comprises:

first and second peripheral portions which delimit the sealed main cavity, below and above, respectively; and an intermediate portion, which is interposed between the first and the second peripheral portions, laterally delimits the main cavity and has a stiffness lower than stiffnesses of the first and the second peripheral portions.

3. The method according to claim 1, wherein detecting the pressure exerted by the solid body includes detecting the pressure exerted by the solid body based on a change in volume of the sealed main cavity from an initial volume prior to the pressure being exerted on the pressure sensor by the solid body.

4. A method, comprising:

deforming a sealed main cavity within a pressure sensor by exerting a pressure on an external surface of a pressure sensor with a solid body; and detecting the pressure exerted on the pressure sensor with the solid body by a MEMS (microelectromechanical system) device within the sealed main cavity of the pressure sensor, detecting the pressure exerted on the pressure sensor by the solid body including:

deforming a deformable structure within a cavity of the MEMS device in fluid communication with the sealed main cavity through a hole extending through the MEMS device to the cavity; and detecting deformation of the deformable structure with a transducer on the deformable structure.

5. The method of claim 4, wherein the pressure sensor is fully enclosed within the solid body.

6. The method of claim 4, wherein detecting the pressure exerted by the solid body includes detecting the pressure exerted by the solid body based on a change in volume of the sealed main cavity from an initial volume prior to the pressure being exerted on the pressure sensor by the solid body.

7. The method of claim 4, further comprising outputting a detection signal output by the MEMS device through a conductive path extending through the pressure sensor from the MEMS device to a conductive pad of the pressure sensor.

8. The method of claim 4, wherein detecting the pressure exerted on the pressure sensor by the solid body further includes deforming a region filling a first portion of the main sealed cavity into a second portion of the main sealed cavity.

9. The method of claim 8, wherein the first portion of the main sealed cavity is larger than the second portion of the main sealed cavity.

10. The method of claim 4, wherein deforming the sealed main cavity within the pressure sensor includes:

deforming a first layer with a first stiffness delimiting a first side of the sealed main cavity;

deforming a second layer with a second stiffness delimiting a second side of the sealed main cavity opposite to the first side of the sealed main cavity; and deforming a third layer with a third stiffness delimiting sidewalls of the sealed main cavity transverse to the first side and the second side of the sealed main cavity, the third stiffness being less than the first stiffness and less than the second stiffness.

11. The method of claim 10, wherein the first stiffness is equal to the second stiffness.

12. The method of claim 10, wherein:

a first external surface of the first layer is covered by the solid body; and a second external surface of the second layer is covered by the solid body.

13. The method of claim 4, wherein deforming the sealed main cavity within the pressure sensor by exerting a pressure on the external surface of the pressure sensor with the solid body further includes:

deforming a first layer of the pressure sensor delimiting a first portion of the sealed main cavity towards a region within the sealed main cavity between the first portion of the sealed main cavity and a second portion of the sealed main cavity.

14. The method of claim 13, wherein a through hole extends through the region fluidically coupling the first portion of the sealed main cavity to the second portion of the sealed main cavity.

15. A method, comprising:

deforming a first layer of a first stiffness of a pressure sensor towards a sealed main cavity within the pressure sensor by exerting a pressure on a first external surface of the first layer of the pressure sensor; and detecting the pressure exerted on the pressure sensor with a solid body by a MEMS (microelectromechanical system) device within the sealed main cavity of the pressure sensor, detecting the pressure exerted on the pressure sensor by the solid body including:

deforming a deformable structure within a cavity of the MEMS device in fluid communication with the sealed main cavity through a hole extending through the MEMS device to the cavity; and detecting deformation of the deformable structure with a transducer on the deformable structure.

16. The method of claim 15, wherein the sealed main cavity includes a first portion with a first dimension in a first direction substantially parallel with the first external surface and a second portion with a second dimension in the first direction, the first dimension being greater than the second dimension.

17. The method of claim 16, wherein the MEMS device is within the second portion of the sealed main cavity.

18. The method of claim 15, further comprising:

deforming a second layer of a second stiffness of the pressure sensor laterally delimiting sidewalls of the sealed main cavity within the pressure sensor by exerting the pressure on the first external surface of the first layer of the pressure sensor.

19. The method of claim 18, further comprising:

deforming a third layer of a third stiffness of the pressure sensor delimiting the sealed main cavity within the pressure sensor and opposite to the first layer by exerting the pressure on a second external surface of the third layer of the pressure sensor.

20. The method of claim 19, wherein the second stiffness is less than the first stiffness and less than the third stiffness.

* * * * *